(12) United States Patent
Alers

(10) Patent No.: US 6,284,663 B1
(45) Date of Patent: Sep. 4, 2001

(54) METHOD FOR MAKING FIELD EFFECT DEVICES AND CAPACITORS WITH THIN FILM DIELECTRICS AND RESULTING DEVICES

(75) Inventor: Glenn B. Alers, Santa Cruz, CA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/434,424

(22) Filed: Nov. 4, 1999

Related U.S. Application Data

(63) Continuation-in-part of application No. 09/060,420, filed on Apr. 15, 1998, now Pat. No. 6,001,741.

(51) Int. Cl.$^7$ ............................................. H01L 21/3065
(52) U.S. Cl. ..................... 438/706; 438/710; 438/720; 438/775
(58) Field of Search ................................. 438/706, 720, 438/775, 710

(56) References Cited

U.S. PATENT DOCUMENTS

| | | | |
|---|---|---|---|
| 4,700,457 | * 10/1987 | Matsukawa | 438/396 |
| 5,336,638 | * 8/1994 | Suzuki et al. | 438/240 |
| 5,349,494 | * 9/1994 | Ando | 361/322 |
| 5,352,623 | * 10/1994 | Kamiyama | 438/396 |
| 5,486,488 | 1/1996 | Kamiyama | 438/396 |
| 5,508,221 | * 4/1996 | Kamiyama | 438/396 |
| 5,688,724 | * 11/1997 | Yoon et al. | 438/778 |
| 5,780,115 | 7/1998 | Park et al. | 427/539 |
| 5,837,593 | * 11/1998 | Park et al. | 438/396 |
| 6,001,741 | * 12/1999 | Alers | 438/706 |

* cited by examiner

*Primary Examiner*—Benjamin L. Utech
*Assistant Examiner*—Lynette T. Umez-Eronini
(74) *Attorney, Agent, or Firm*—Lowenstein Sandler PC

(57) ABSTRACT

An electronic device having an improved capacitor structure is formed by depositing a metal layer defining a first electrode on a film of high dielectric constant material, and then depositing the dielectric layer of the capacitor structure on the first electrode. This resulting structure is then exposed to a nitrogen plasma and the top electrode is formed. Exposing the first electrode to a plasma of pure nitrogen prevents the partial oxidation of the first electrode and reduces the density of charge traps at the electrode/dielectric interface. The dielectric film is passivated with the nitrogen material before forming the top electrode to prevent interdiffusion between the electrode and the dielectric.

12 Claims, 4 Drawing Sheets

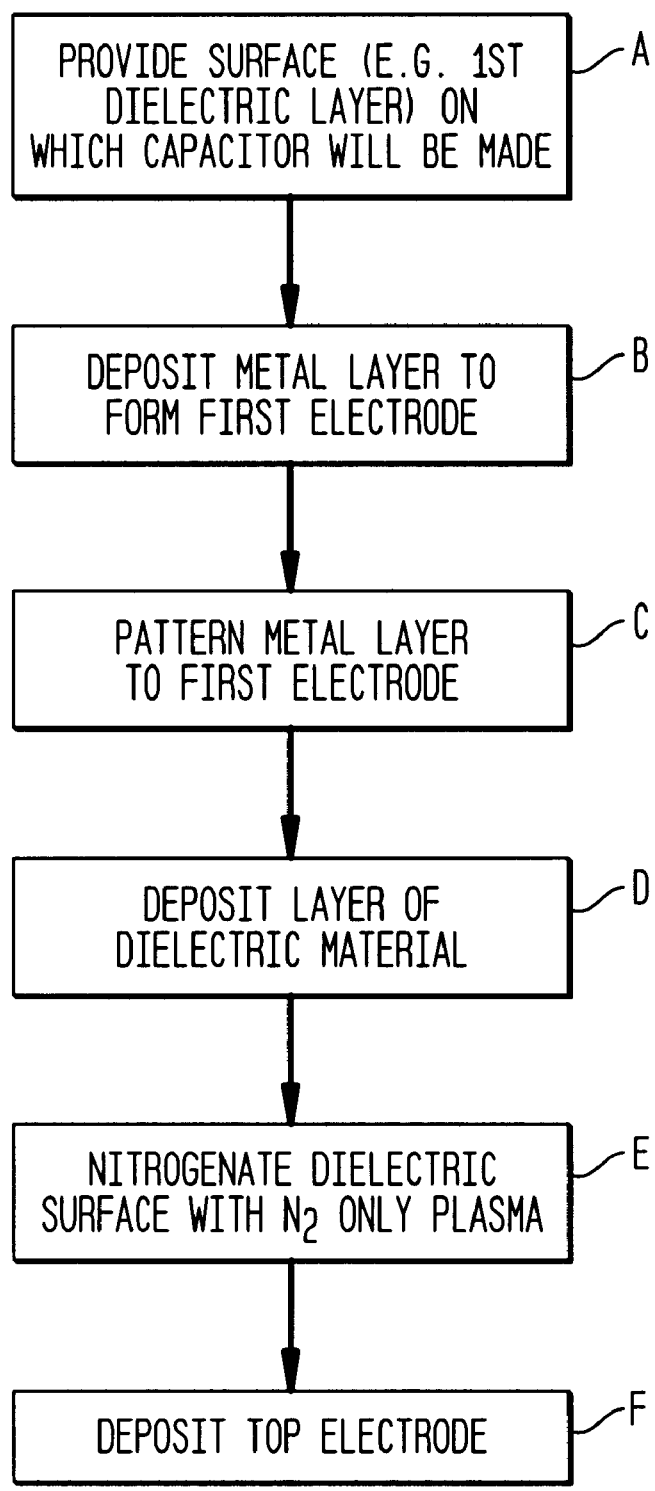

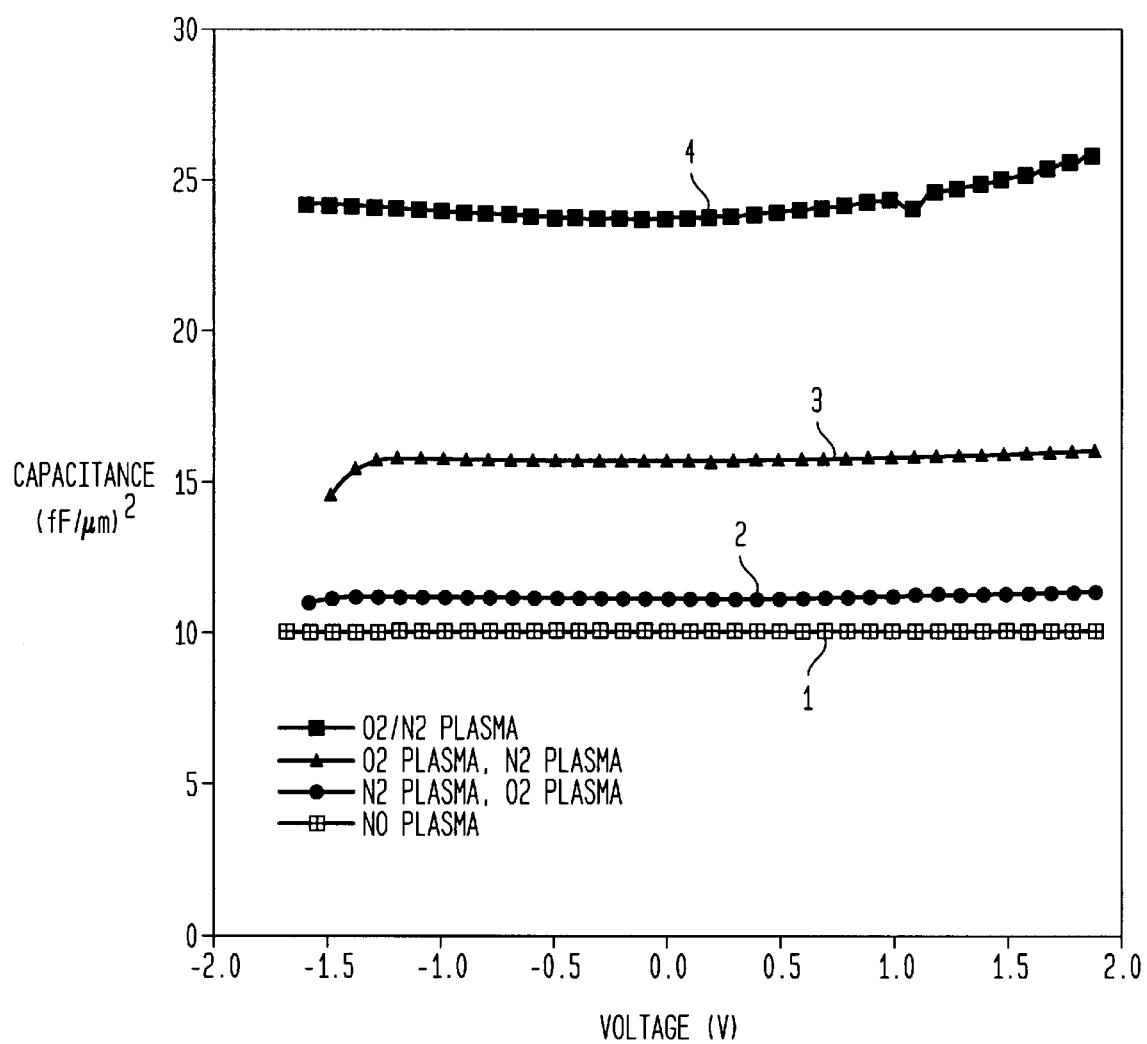

METHOD FOR MAKING FIELD EFFECT DEVICES AND CAPACITORS WITH THIN FILM DIELECTRICS AND RESULTING DEVICES

RELATED APPLICATIONS

This application is a continuation-in-part application to U.S. patent application Ser. No. 09/060,420, filed Apr. 15, 1998, now U.S. Pat. No. 6,001,741, issued on Dec. 14, 1999, incorporated herein by reference, and claims the benefit of the filing date thereof.

FIELD OF THE INVENTION

This invention relates to a method for making electronic devices with thin film dielectrics and to the resulting devices.

BACKGROUND OF THE INVENTION

Field effect devices, such as field effect transistors, are fundamental components in modern electronics. The metal-oxide semiconductor field effect transistor (MOSFET) is a dominant and important device in fabricating very large-scale integrated circuits, and various types of MOSFETs are known. MOSFET technology basically can be categorized as consisting of NMOS, PMOS, and CMOS technology. NMOS denotes n-channel MOS devices, PMOS denotes p-channel devices, and CMOS denotes devices having n-channel and p-channel areas integrated on the same chip. Other acronyms are used to identify MOSFETs, including DMOS (wherein "D" stands for "diffusion" or "double diffusion"), IGBT (Insulated Gate Bipolar Transistor), BiCMOS (CMOS having bipolar devices), and DGDMOS (Dual Gate DMOS).

MOSFET devices typically comprise a controllable-conductivity path, called a channel, disposed between a source and a drain. A gate electrode is formed on a thin dielectric film overlying the channel. For example, the source and the drain can be n-type regions of silicon, and the channel can be a p-type region connecting them. The gate electrode can be a conductively doped polysilicon layer formed on a thin layer of silicon oxide dielectric overlying the channel.

If no voltage is applied to the gate, current cannot flow from the source to the channel or from the channel to the drain. However, if a sufficient positive voltage is applied to the gate, electrons are induced into the channel region, thereby creating a continuous conductive path between the source and the drain.

Capacitors are also important components of integrated circuits. A typical capacitor comprises first and second conductive layers separated by a thin dielectric film.

A capacitor may be fabricated on an MOS device to form a memory cell. For example, a common design used in a dynamic random access memory (DRAM) cell involves a transfer gate (e.g., a MOSFET), and a storage node consisting of a capacitor. A common design for a DRAM cell is shown in FIG. 1. This cell includes a substrate 12, comprised typically of silicon, containing source 13 and drain 14 diffusions for the MOFSET. Gate structures 16a, 16b are fabricated on the substrate. The substrate 10 also will have on its surface a field oxide pattern (or FOX) 18. The capacitor portion 40 is disposed on the gates, comprising a bottom electrode 20 and top electrode 21, separated by a thin film of dielectric material 22. The bottom electrode 20 and top electrode 21, together with the interlying thin dielectric film 22, form a capacitor. An insulating layer 24 may separate the capacitor from the gate structures 16a, 16b.

The reliable operation of integrated circuits is dependent on the reliability of the increasingly thin dielectric layers used in circuit devices. As transistors have become smaller and more densely packed, the dielectrics have become thinner. Capacitor and gate dielectrics are often less than 80 angstroms in thickness and are approaching 50 angstroms or less. For integrated circuits to work, these thin layers in each of thousands of different transistors must provide sufficient capacitance to drive the device, protect the channel from migration of impurities, and avoid production of charge traps at their interfaces. These demanding requirements may soon exceed the capacities of conventional silicon oxide layers. Silicon oxide layers less than 2 nm will have prohibitively large leakage currents.

Efforts to replace silicon oxide as the gate dielectric have thus far proved less than satisfactory. The relatively low dielectric constant ($\approx 3.9$) of silicon oxide limits the scaling of transistors to smaller sizes, because the capacitance may not be sufficient to drive the devices. Higher dielectric constant materials are being developed. For example, tantalum oxide has been tried as a dielectric layer of a capacitor portion of a DRAM cell (e.g., layer 22 of FIG. 1). However, in this case reactions occur between the lower metal electrode (e.g., 20 of FIG. 1) and the oxide film 22 to partially oxidize the electrode 20. This partial oxidation creates suboxides at the interface of the metal electrode and the dielectric. The partially oxidized layer thus formed can have a high density of electron traps that can lower the capacitance of the structure and increase leakage current. Accordingly, there is a need for an improved method for making devices having thin layers of high dielectric constant and particularly layers of dielectric constant used in a capacitor portion of an electronic device such as a DRAM cell.

SUMMARY OF THE INVENTION

Summarily described, the invention embraces a process for forming an electronic device having a capacitor portion. A film of metal is deposited on a surface such as the surface of an insulating or dielectric layer overlying a substrate. The metal film may be patterned such as with use of a photoresist or metal etching. A metal oxide layer is deposited on the metal film, and the top electrode is formed. The structure is exposed to a remote plasma of nitrogen after the metal oxide layer is deposited and before forming the top electrode. The plasma substantially reduces the density of charge traps at the metal electrode/dielectric interface through incorporation of nitrogen at the interface.

BRIEF DESCRIPTION OF THE DRAWINGS

The advantages, nature and various additional features of the invention will appear more fully upon consideration of the illustrative embodiments now to be described in detail. In the accompanying drawings:

FIG. 2 is a flow diagram showing steps of the method for making an electronic device having an improved capacitor structure;

FIG. 4 is a graphical illustration showing the capacitance as a function of voltage for four different devices.

Figure 1:
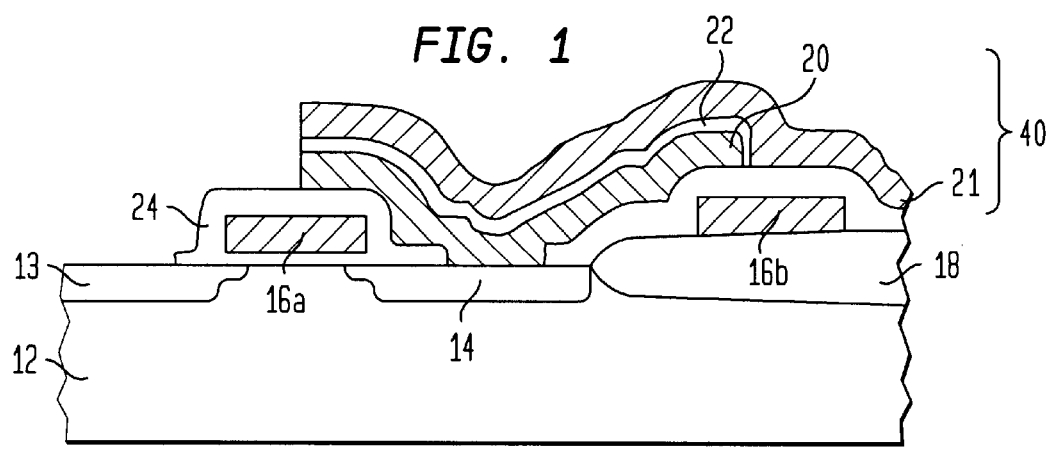
FIG. 1 is a schematic illustration of a DRAM cell.

It is to be understood that these drawings are for purposes of illustrating the concepts of the invention and except for the graphs, are not to scale.

DETAILED DESCRIPTION OF THE INVENTION

Referring to the drawings, FIG. 2 illustrates the steps for making an electronic device having an improved thin film dielectric. As shown in block A of FIG. 2, the first step is to provide a surface on which the capacitor structure will be formed. This surface may comprise an insulating layer deposited on an MOS device, e.g., separating the MOS device from the capacitor structure of a DRAM cell, such as insulating layer 24 of FIG. 1.

The next step shown in block B is to deposit a layer of metal on the insulating layer (e.g., metal layer 20 of FIG. 1). The metal layer may comprise a tungsten metal film, a tungsten nitride film, or a tungsten silicide film. A titanium nitride or tantalum nitride polysilicon film also may be used. The metal layer may comprise an elemental or binary metal or a combination of materials selected from the group of tungsten, titanium, tantalum, and molybdenum. The metal layer may be deposited by methods known in the field including chemical vapor deposition and reactive sputtering. It can be patterned in a desired geometry on the insulating layer 24 to define a lower electrode, applying patterning techniques known in the field (e.g., with use of photoresist and metal etching). This patterning step is shown in block C of FIG. 2.

A surface passivation step of the lower electrode is disclosed in U.S. Pat. No. 5,780.115 issued to Parks et al. In Parks, this passivation step is applied before the dielectric is deposited to remove native oxide from silicon. However, the Parks process does not apply to metal electrodes, where removal of the oxide is not as critical. This process relies upon an increased thickness of the interfacial passivation region that forms during the plasma treatment to increase the capacitance, thereby producing thicker devices. For example, this process reaches a minimum equivalent silicon dioxide thickness of only 3 nm.

Next, the fourth step (block D) involves depositing a thin layer of high dielectric constant material (e.g., layer 22 of FIG. 1). Preferably, this layer comprises tantalum oxide (e.g.,$Ta_2O_5$), or another high dielectric constant material. The dielectric can be deposited on the metal layer as by chemical vapor deposition (CVD) or low pressure CVD (LPCVD), as is known in the field. The deposition should be at a temperature of less than 450° C. to prevent oxidation of the lower metal electrode.

A treatment of silicon films which may include a plasma treatment using oxygen gas or other oxidizing gases is disclosed in U.S. Pat. No. 5,486,488 issued Jan. 23, 1996 to Kamiyam, incorporated herein by reference. Applicants have discovered that use of an oxidizing gas as in Kamiyam is disadvantageous, as the oxygen can oxidize the lower electrode/dielectric interface during densification and therefore reduce capacitance. The Kamiyam process densifies the $Ta_2O_5$ film only and does not consider the impact the densification process will have on the electrode/dielectric interface.

The interface may be stabilized by a fifth step (block E) involving subsequent exposure to nitrogen plasma. This step shown in block E involves nitrogenating the dielectric surface, i.e. a nitrogen plasma is applied at the top surface of the dielectric. This exposure may be to a remote microwave downstream plasma, e.g., a nitrogen plasma applied at 2 Torr with the substrate temperature at 100–500° C. (preferably 300° C.), which stabilizes the bottom gate/dielectric interface through incorporation of nitrogen. The nitrogen plasma may be followed by an oxygen plasma, also at 2 Torr with the substrate temperature at 100–500° C. (preferably 300° C.), to density the dielectric layer and reduce leakage currents. Exposure of the dielectric film to a plasma that contains nitrogen only adds nitrogen to the oxide/dielectric interface. FIG. 6 is a composition-depth profile of a dielectric film on silicon after exposure to a nitrogen plasma. Nitrogen ions are detected at the dielectric/silicon interface which indicates that the nitrogen has penetrated into the dielectric layer during the plasma process and bonded to the underlying silicon layer to passivate free silicon bonds with nitrogen. The passivation of these bonds with nitrogen instead of oxygen is highly advantageous in retarding the growth of oxide, reducing interface leakage, and increasing the capacitance of the device. Such passivation thus makes it possible to avoid a step of passivating the lower electrode directly.

The sixth step (block F) is to deposit the top electrode (e.g., layer 21, FIG. 1). This step typically involves depositing a top electrode of metal such as TiN, TaN, W or WN. The deposition can by CVD or PVD, preferably at a temperature of less than 800° C., and more preferably at a temperature less than 600° C.

Figure 3:
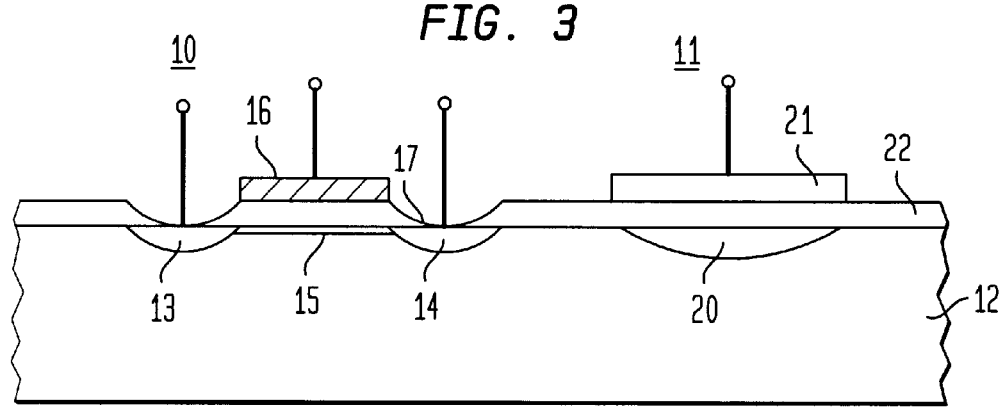
FIG. 3 is a schematic cross section illustrating a field effect device and a capacitor having an improved dielectric layer.
Figure 5:
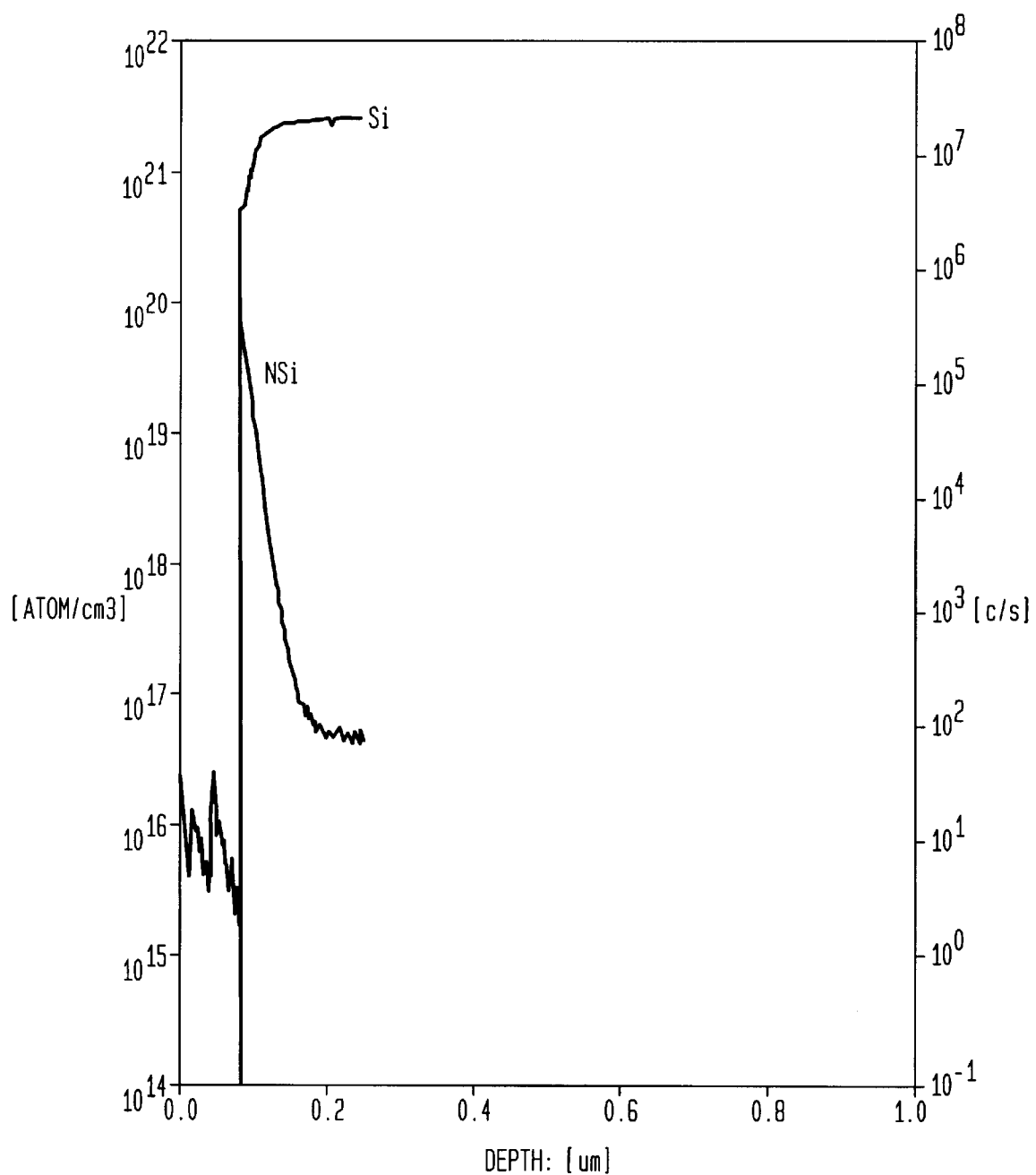
FIG. 5 is a graphical illustration showing the composition-depth profile of a dielectric film on silicon after exposure to a nitrogen plasma.

The above process may be applied to fabrication of a DRAM cell, as illustrated in FIG. 1, with the capacitor structure deposited on the gate electrodes of a MOS transistor. However, other applications involving fabrication of a capacitor structure are contemplated. FIG. 3 is a schematic cross section of an exemplary electronic device illustrating a field effect device 10 and capacitor 11 having improved dielectric layers, with like characters used to denote like features as in FIG. 1. While not necessary for the invention, in this particular instance both the field effect device and the capacitor are formed on a common substrate 12, such as a crystalline silicon wafer.

The field effect device 10 (here a transistor) essentially comprises a source 13, a drain 14 and a channel 15, each of which can comprise a doped region of silicon supported by substrate 12. A gate electrode 16 overlies the channel 15 and is separated from the channel by a thin dielectric film 17. As depicted, the dielectric film has a pair of major interfaces adjacent the gate electrode 16 (the gate/dielectric interface) and the channel 15 (the dielectric/Si interface). The dielectric film typically has a thickness of less than about 200 angstroms. The gate electrode 16 is typically a thin layer of polycrystalline silicon doped to exhibit conductivity. Capacitor 11 comprises a pair of conductive layers 20 and 21 separated by a thin dielectric film 22. The capacitor structure of conductive layers 20 and dielectric film 22 can be fabricated using the process described above. The dielectric film 22 can be a tantalum oxide film, as aforementioned, with the top and bottom electrodes comprising one or more of TiN, TaN, W or WN.

FIG. 4 is a graphical illustration showing the effect of the plasma treatment after deposition of the dielectric upon capacitance with a capacitor having a TiN/$Ta_2O_5$/TiN structure. Curve 1 shows the capacitance at various voltages of an untreated film. Note the value of the capacitance is limited to approximately 10fF/$\mu m^2$. Curve 2 shows the effect of a plasma treatment involving application for 1 minute of $O_2/N_2$ plasma at 300° C. Curves 3 and 4 show the increased results that are obtained when a $N_2$-only plasma treatment is applied to the first electrode according to the invention. Curve 3 shows the capacitance when an $O_2$ plasma is used, followed by an $N_2$ only plasma treatment. Curve 4 shows the capacitance when an $N_2$ only plasma treatment is applied before any oxygen is used. As can be seen, improved results are obtained when a pure nitrogen plasma is used, either before or after an oxygen plasma, and the results are dramatically improved (e.g., curve 4), when pure nitrogen is applied first. The term "pure nitrogen" as used herein means nitrogen without oxygen, and of course, one skilled in the field would understand that an inert gas such as argon or helium may be used as well.

Additionally, it should be understood that the above processing conditions are exemplary. The nitrogen anneal gas may be introduced (i.e., in the fifth step, block E), into an annealing chamber at a pressure of 0.1 to 10 Torr from a remote plasma source that generates nitrogen radicals. The remote plasma chamber may use a microwave source to generate the plasma at a frequency of roughly 2.5 GHz. Alternatively, the plasma may be generated with an applied RF bias at a frequency of roughly 13 MHz and a gas that contains both nitrogen and an inert gas such as argon or helim.

It is to be understood that the above-described embodiments are illustrative of only a few of the many embodiments which can represent applications of the invention. Numerous and varied other arrangements can be readily devised by those skilled in the art without departing from the spirit and scope of the invention.

What is claimed:

1. A method of making an electronic device having a capacitor structure comprising in sequence:

depositing a metal layer defining a first electrode of the capacitor on a film of dielectric material;

depositing a second dielectric layer on the first electrode to form the dielectric layer of the capacitor; exposing the film of dielectric to a pure nitrogen plasma to reduce the density of charge traps at the dielectric/electrode interface; and depositing a second metal layer on the second dielectric layer to define the second electrode of the capacitor structure.

2. A method of making a capacitor structure of an electronic device having a thin film of dielectric material, the method comprising:

a) providing a substrate;

b) depositing a first film of dielectric material on said substrate to define a first dielectric layer;

c) depositing a first layer of metallic material on said first dielectric layer;

d) patterning the first layer of metallic material to define a first electrode of the capacitors;

e) depositing a second layer of dielectric material on the first electrode to define the dielectric layer of the capacitor;

f) exposing the second dielectric layer to a pure nitrogen plasma to reduce the density of charge traps at the interface between the first electrode and the second dielectric layer; and g) forming a second electrode overlying said second dielectric layer to complete said capacitor structure.

3. The method of claim 2 wherein said step of exposing the second dielectric layer to plasma comprises first exposing to a plasma of nitrogen with no oxygen at a substrate temperature in the range 100–500° C.

4. The method of claim 2 wherein said second dielectric layer is a metal oxide having a dielectric constant greater than 5.

5. The method of claim 4 wherein said second dielectric layer comprises tantalum oxide.

6. The method of claim 5 wherein said step of exposing the second dielectric layer to plasma comprises first exposing to a plasma of nitrogen with no oxygen at a substrate temperature in the range 100–500° C. and then exposing the second dielectric layer to a plasma of oxygen.

7. The method of claim 2 wherein said step of exposing the second dielectric layer to plasma comprises first exposing to a plasma of oxygen and then exposing to a plasma of pure nitrogen at a substrate temperature in the range 100–500° C.

8. The method of claim 2 wherein said step of depositing a dielectric material on the first electrode comprises depositing a film of dielectric material having a thickness in the range 2–10 nm.

9. The method of claim 2 in which the first and second electrodes are fabricated with a metal selected from the group consisting of TiN, W, TaN and WN.

10. A method of making a capacitor structure incorporated in an electronic device having a thin film of dielectric material, the method comprising in sequence:

(a) providing a substrate comprising a MOS device having at least one gate electrode;

(b) depositing a first film of dielectric material on said MOS device overlying said gate electrode to define a first dielectric layer;

(c) depositing a first layer of metallic material on said first dielectric layer;

(d) patterning the first layer of metallic material to define a first electrode;

(e) depositing a layer of tantalum oxide on the first electrode to define a second dielectric layer;

(f) exposing the second dielectric layer to a first plasma comprising pure nitrogen and a second plasma containing oxygen, wherein the first and second plasmas are each applied at a substrate temperature in the range 100–500° C. to reduce the density of charge traps at the interface between the first electrode and the second dielectric layer; and (g) forming a second electrode overlying said second dielectric layer to complete said capacitor structure.

11. The process of claim 10 in which the first and second plasmas are applied sequentially, the first plasma being applied before the second plasma.

12. The process of claim 10 in which the first and second plasmas are applied sequentially, the second plasma being applied before the first plasma.

* * * * *